United States Patent [19]

Tabuchi et al.

[11] Patent Number: 4,507,581
[45] Date of Patent: Mar. 26, 1985

[54] ELECTRODE STRUCTURE FOR SAW DEVICE

[75] Inventors: Toyoji Tabuchi; Mitsutaka Hikita, both of Hachioji, Japan

[73] Assignee: Hitachi, Ltd., Tokyo, Japan

[21] Appl. No.: 536,521

[22] Filed: Sep. 28, 1983

[30] Foreign Application Priority Data

Sep. 29, 1982 [JP] Japan .................... 57-168353

[51] Int. Cl.³ .............................................. H03H 9/25
[52] U.S. Cl. .................... 310/313 B; 333/154; 333/196
[58] Field of Search .............. 310/313 B; 333/154, 333/193, 194, 195, 196

[56] References Cited

U.S. PATENT DOCUMENTS 3,882,433  5/1975  Subramanian ............ 310/313 B
3,936,774  2/1976  Mellon et al. ............. 310/313 B
4,162,465  7/1979  Hunsinger et al. ......... 310/313 B

OTHER PUBLICATIONS

"90 MHz Band Low Loss SAW Filters", The Inst. of Electr. and Comm. Eng. of Japan, US 81-23, CPM 81-21, p. 33, Jul. 20, 1981.

Primary Examiner—William H. Beha, Jr.
Assistant Examiner—D. L. Rebsch
Attorney, Agent, or Firm—Antonelli, Terry & Wands

[57] ABSTRACT

At least two frequencies, one on the higher frequency side and the other on the lower frequency side of a desired frequency, are selected from a predetermined set of frequencies, and stripe widths corresponding to the selected frequencies are combined to realize a desired average stripe width which is used to form an electrode structure of a SAW device. At least one electrode configuration of the SAW device includes an alternate arrangement of electrode stripe and free area stripe and the alternate arrangement is divided into a predetermined number of plural sections within each of which a ratio of the number of stripes of a first width to the number of stripes of a second width is set to a predetermined value. The electrode configuration can be prepared without resort to a highly precise mask and can permit highly precise setting of the center frequencies.

17 Claims, 8 Drawing Figures

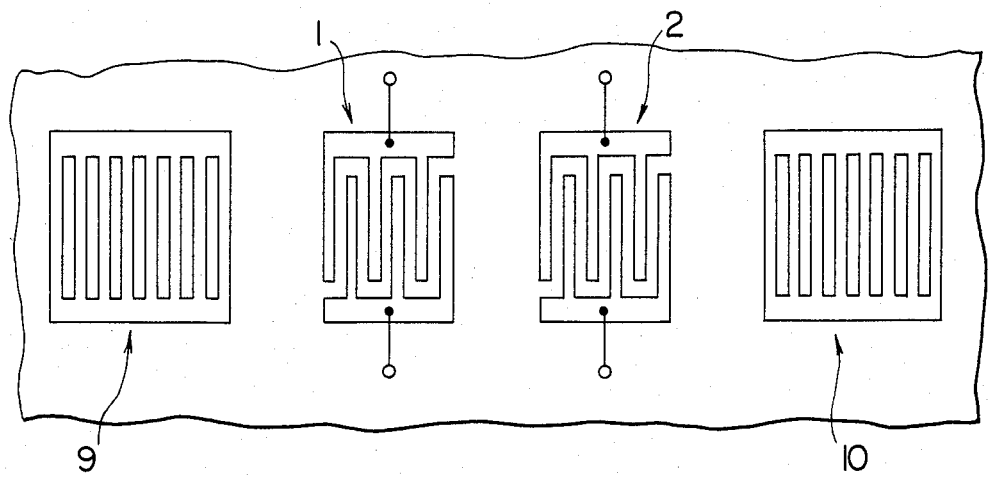
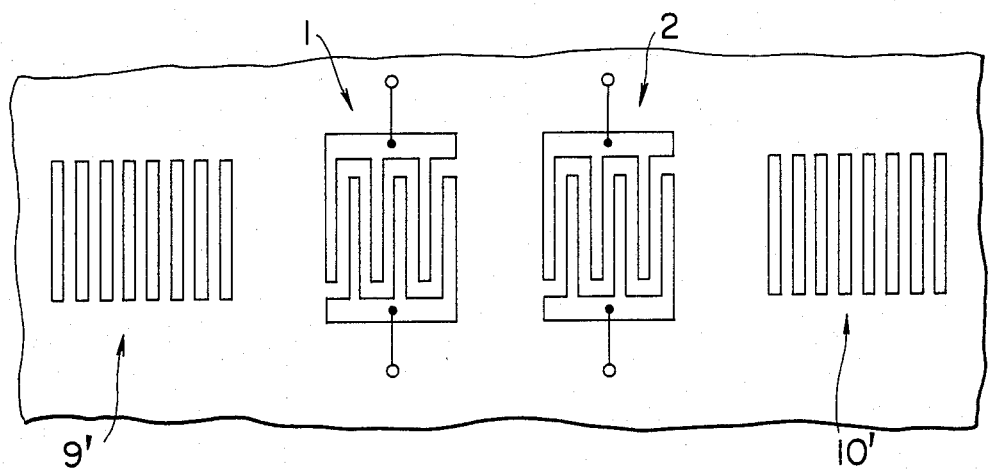

ELECTRODE STRUCTURE FOR SAW DEVICE

BACKGROUND OF THE INVENTION

This invention relates to surface acoustic wave (SAW) devices and more particularly to an electrode structure for a SAW device.

The SAW device comprises a pair of electro-SAW transducers and a SAW propagation path established therebetween. In each transducer, parallel stripe electrodes are formed on a polished piezoelectric substrate so as to effect conversion between an electric signal and a SAW signal. Usually, the SAW propagation path is contituted by part of the polished piezoelectric substrate which is used in common for the transducers.

An acoustic wave that has frequencies as high as several gigahertz travels on the optically polished surface of a piezoelectric substrate at a velocity which is only about $10^{-5}$ times that of electromagnetic waves. A surface acoustic wave thus has the slow-travel property of sound while retaining the microwave frequency of its source. Saw devices utilize these properties and include a variety of delay lines, filters, pulse processors, and other microwave devices and circuits. In a SAW delay line, the delay is determined by the distance traveled by a surface acoustic wave on a piezoelectric surface.

In a SAW filter, the frequency characteristics of the filter are determinable mainly dependent on the velocity (sound velocity) of the SAW and an electrode pattern of the input/output transducers.

The electrode pattern of the transducer includes a plurality of parallel stripe electrodes. The orientation of the stripes determines the direction of a wave front. In a single phase transducer, all the stripe electrodes are maintained at a single phase, and one electrode stripe and one free area stripe (a gap region between adjacent electrodes) define a region for one wavelength. In an interdigital transducer, electrode stripes are formed at an interval of ½ wavelength, and two-phase control is carried out. More particularly, two comb shaped electrodes each having a plurality of electrode fingers are opposed and interlocked and they are maintained at opposite phases. Two electrode stripes and two free area stripes, four stripes in total, define a region for one wavelength. Typically, all of the stripes have the same width l which is $\lambda/4$, where $\lambda$ represents a wavelength of a SAW. For general knowledge of the SAW, reference should be made to IEEE. Trans, MTT-17, 11 (1969), "Special Issue on Microwave Acoustics". A proposal has been reported in which the finger widths of one electrode in an interdigital structure are enlarged in order to improve electrical, SAW reflective and the like characteristics of a transducer ("$\pi$ MHz Band Low Loss SAW Filters" The Institute of Electronics and Communication Engineers of Japan, US 81-23, CPM 81-21, p33, July 20, 1981).

The stripe width needs to be decreased in proportion to a desired increase in the frequency. In an interdigital transducer for frequencies of several hundreds megahertz or more, the stripe width is often prescribed to be 5 $\mu$m or less. In order to precisely set a center frequency for pass band of a filter within such a high frequency range, a pattern precision of submicron or less is required. When preparing an electrode pattern through typical photolithographic technology, the pattern precision is limited to some extent. For example, on account of the fact that the line width of a photomask pattern can be adjusted (increased or decreased) in steps of 0.1 $\mu$m, the frequency cannot be controlled by a fraction of 1/10 or less of a center frequency when the pattern line width is 1 $\mu$m.

With a center frequency of 800 MHz, an adjacent center frequency will be displaced therefrom by as large an amount as 80 MHz, thus preventing efficient utilization of the frequency range. Conversely, when it is desired to utilize the current UHF band, SAW devices fail to cover the entire range.

Electron beam exposure techniques can assure more precise adjustment of the pattern line width, but it disadvantageously requires complicated and expensive mask preparation processes.

Under the circumstances, the advent of SAW devices in which fine adjustment of the center frequency can be accomplished without resort to a highly precise electrode pattern has been needed urgently.

SUMMARY OF THE INVENTION

An object of this invention is to finely modify a center frequency determined by a first part of stripes of an electrode pattern in a SAW device by means of a second part of the electrode pattern.

Another object of this invention is to provide an electrode structure for a SAW device which is easy to control the center frequency precisely.

According to an aspect of the invention, a set of center frequencies is prepared without resort to highly precise processes, a frequency which is closest to a desired center frequency is selected from the set of center frequencies, and a frequency corresponding to a difference between the desired center frequency and the selected frequency is finely adjusted by partially adjusting the width of the stripes. For example, two reference frequencies, one on the higher frequency side and the other on the lower frequency side of a desired center frequency, are selected, and stripe widths corresponding to the reference frequencies are combined to provide the desired center frequency as a whole. Such an electrode structure has a plurality of equivalent sections, each section including stripes of two or more different widths at a predetermined ratio of the numbers of stripes having the different widths.

For example, one section is constituted by 10 stripes; the 10 stripes are divided into a first part corresponding to a frequency f and a second part corresponding to an adjacent frequency f$\pm\Delta$f, and the ratio of the numbers of stripes belonging to the two parts is adjusted to provide a precision of frequency which is a fraction of the 1/10 separation from the reference frequency $\Delta$f involved. Preferably, patterns in the respective sections are made identical to each other, and the pitch defined by the i-th electrodes in each section is made coincident with a predetermined amount of a SAW wavelength of a desired frequency. Advantageously, a mask of this electrode structure has repetition of the same pattern, thus making it easy to prepare the mask.

Teachings of the present invention may also be applied to a reflector electrode. In a reflector of the oblique incidence type, the orientation of stripes is different from the direction of a wave front, but the pitch of stripes may be calculated readily.

As described previously, in the field of a high frequency band filter with a small pitch of electrodes, difficulties are encountered in obtaining frequency characteristics which meet a variety of requested specifications through the currently available photolithographic technology. However, the present invention is compatible with the current specifications prescribed in the preparation of the photomask so as to set the center frequency with a precision which may be a fraction of 1/10 or less of the frequency involved, thereby facilitating design of filter frequency characteristics and reducing cost of the photomask.

Other objects, features and advantages of the present invention will become apparent from the following detailed description taken in conjunction with the accompanying drawings.

BRIEF DESCRIPTION OF THE DRAWINGS

FIGS. 2A to 2E, are fragmentary top views of interdigital electrode patterns, wherein FIG. 2A shows an interdigital structure corresponding to a reference wavelength $\lambda_0$, FIG. 2B shows an interdigital structure corresponding to a wavelength $\lambda_0 + \Delta l$, FIG. 2C shows an interdigital structure corresponding to a wavelength $\lambda_0 + \frac{1}{2}\Delta l$, FIG. 2D shows an interdigital structure corresponding to a wavelength $\lambda_0 + 2/5\ \Delta l$, and FIG. 2E shows an interdigital structure corresponding to a wavelength $\lambda_0 + 4/5\ \Delta l$.

FIGS. 3A and 3B are fragmentary top views of surface acoustic wave devices including reflectors.

DESCRIPTION OF THE PREFERRED EMBODIMENTS

Figure 1:
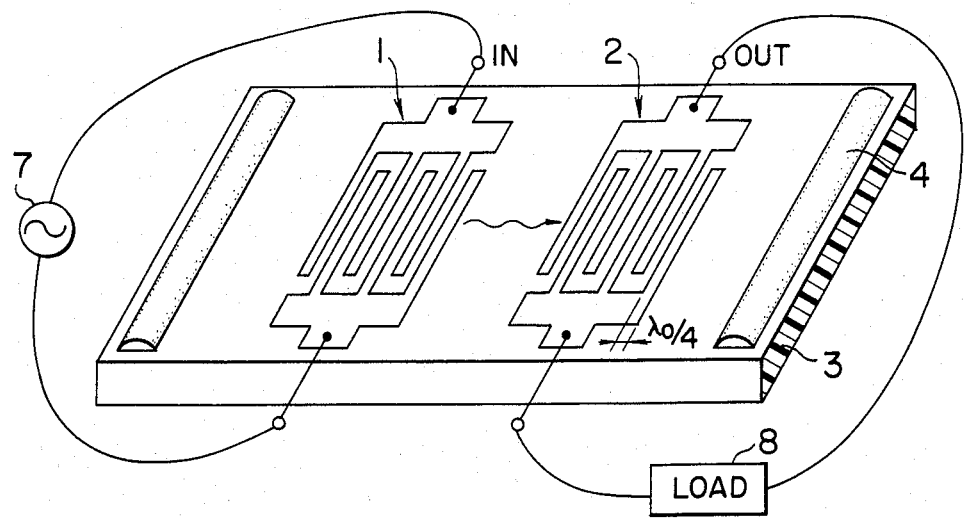
FIG. 1 is a perspective view showing a basic construction of a surface acoustic wave (SAW) device.

FIG. 1 shows schematically a SAW device, in which two interdigital electrode configurations 1 and 2 are deposited on a piezoelectric substrate 3 to form an input (transmitting) transducer and an output (receiving) transducer. A reflectionless surface wave termination 4 serves to attenuate the surface acoustic wave and prevent reflection thereof at the end surface of the substrate. Connected to the input and output transducers are a microwave source 7 and a load (or utilization circuit) 8.

The electrode configurations 1 and 2 are made of metal, for example, aluminum or gold. The piezoelectric substrate 3 is a bar of a piezoelectric material having one optically polished major surface and is made of a single crystal such as lithium tantalate LiTaO$_3$, lithium niobate LiNbO$_3$, or quartz SiO$_2$, or a ceramic material such as lead zirconate titanate (PZT). In structural dimension, the substrate 3 is about 2 mm square, for example. At intervals between electrode stripes, the substrate is exposed.

A SAW-travel distance between the input transducer 1 and the output transducer 2 determines a delay time of an output signal with respect to an input signal.

For simplicity of illustration, the number of finger pairs in the interdigital electrode is shown as three in each transducer, amounting to six in one device but practically, it amounts to 10 to 500, typically about 50, in one device. The electrode finger has a length of about 200 $\mu$m, for example. The input and output transducers are disposed within an area of about 200 $\mu$m × 500 $\mu$m, for example. A large number of chips are arranged in a substrate during the manufacture and thereafter severed apart.

Within the transducer, a wave front is formed along an imaginary linear line which is parallel to the electrode stripes. Where a surface acoustic wave has a wavelength $\lambda$, an in-phase condition will be established at imaginary linear lines which are n$\lambda$ (n:interger) distant from a linear line representative of one wave front an opposite phase condition will be established at linear lines which are (n+$\frac{1}{2}$) $\lambda$ distance from the one wave front. In the interdigital transducer, signals in opposite phases are applied to two electrodes, interlocked to each other, so as to excite a surface acoustic wave. Accordingly, the pitch of adjacent electrode fingers coincides with a half wavelength $\lambda/2$. From the standpoint of simplicity of analysis and precision of the photolithograph, it is desirable that the electrode finger have the same width as that of a free area between adjacent electrode fingers. In this case, the width is $\lambda/4$ for both the electrode finger and free area. Thus, the electrode pattern includes a large number of contiguous stripes each having a width of $\lambda/4$, with alternate stripes constituting electrode areas and the remaining alternate stripes constituting free areas. More specifically, alternate electrode stripes are connected in common to provide one comb shaped electrode and the remaining alternate electrode stripes are connected in common to provide the other comb shaped electrode. Four contiguous stripes corresponds to one wavelength $\lambda$. With a LiTaO$_3$ 36° Y - X bar, for example, the wavelength $\lambda$ is 4.8 $\mu$m for a center frequency of 870 MHz and the stripe width is 1.2 $\mu$m which is $\frac{1}{4}$ of one wavelength $\lambda_0$. Accordingly, by selecting a stripe width properly, a desired center frequency can be obtained.

According to the current techniques, the step of changing the pattern width is usually limited. In many applications, the minimum step of varying the pattern width is 0.1 $\mu$m and a selectable pattern widths are, for example, 1.0 $\mu$m, 1.1 $\mu$m, 1.2 $\mu$m, 1.3 $\mu$m, . . . . Correspondingly, selectable center frequencies are approximately 1045 MHz, 950 MHz, 870 MHz and 800 MHz. The frequency interval is therefore 70 MHz or more and freedom of design is limited considerably, thus failing to satisfy requirements for a UHF filter, for example.

Figure 2A:
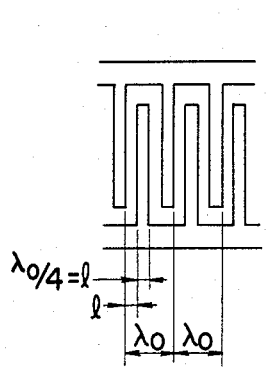

FIGS. 2A to 2E show enlarged fragmentary views of different electrode patterns. In particular, FIG. 2A illustrates a reference pattern in which all of the stripe widths are equal. One wavelength is represented by $\lambda_0$ and a $\frac{1}{4}$ wavelength corresponding to one stripe width is represented by l.

The minimum value of changes $\Delta l$ of the stripe width is limited to a 0.1 $\mu$m by the photomask preparation technique, for example. Accordingly, there arises a problem when a precision which is a fraction of 0.1 $\mu$m or less is required for the line width.

When the change $\Delta l$ of the width is applied to all the stripes (electrode fingers and insulating areas between adjacent electrode fingers) as in the prior art device, the relative rate of pitch change $\Delta P_o$ is expressed as, $$\Delta P_o = \frac{4 \cdot \Delta l}{\lambda_o} \qquad (1)$$

Figure 2B:
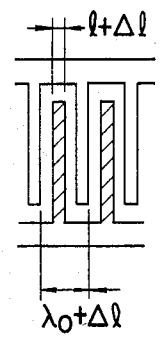

In FIG. 2B, the width of the second stripe in every 4 stripe group defining one wavelength is changed and relative rate of pitch change $\Delta P_1$ is written as, $$\Delta P_1 = \frac{\Delta l}{\lambda_o} = \frac{1}{4} \Delta P_o \qquad (2)$$

In the figure, the width of electrode stripes belonging to one comb shaped electrode in the interdigital electrode is adjusted but alternatively, the width of the inter-electrode gap (free area stripe) may be adjusted. By changing the width of one stripe in every 4-stripe groups in this manner, fine adjustment capable of providing a fraction of ¼ of the prior art adjustment can be ensured.

Figure 2C:
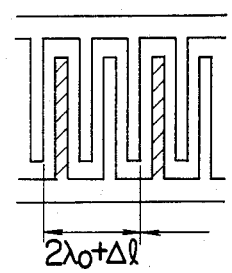

In FIG. 2C, the width of one stripe in every 8-stripe group is changed and the relative rate of pitch change $\Delta P_2$ is written as, $$\Delta P_2 = \frac{\Delta l}{2\lambda_o} = \frac{1}{2} \Delta P_1 = \frac{\Delta P_o}{8} \quad (3)$$

Figure 2D:
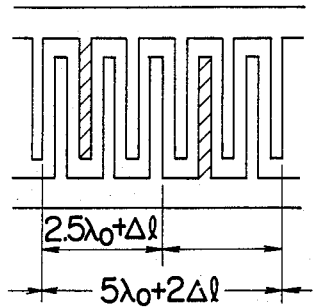

In FIG. 2D, the width of one stripe in every 10-stripe group is changed and the relative rate of pitch change $\Delta P_3$ is written as, $$\Delta P_3 = \frac{\Delta l}{2.5\lambda_o} = \frac{1}{2.5} \Delta P_1 = \frac{1}{10} \Delta P_o \quad (4)$$

As compared to a case wherein the widths of stripes are changed uniformly, a precision of 1/10 can be obtained in terms of average pitch. In other words, the precision can be improved by one order. Considering that two comb shaped electrodes of the interdigital electrode are different to each other, i.e. independent in the electrode pattern, the repetition period of the pattern should be five wavelengths (20 stripes).

Figure 2E:
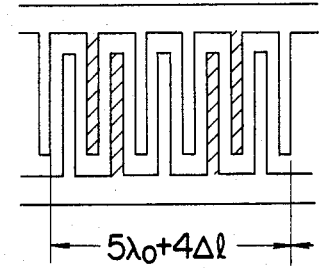

In FIG. 2E, the repetition period is five wavelengths (20 stripes) as in FIG. 2D. Four stripe widths are changed in every 20-stripe group and the relative rate of pitch change $\Delta P_4$ which is written as, $$\Delta P_4 = \frac{4\Delta l}{5\lambda_o} = \frac{2}{10} \Delta P_o \quad (5)$$

can be obtained. In FIGS. 2C to 2E also, the width of the free area stripe may be changed.

In this manner, a predetermined change of the stripe width is effected at a predetermined period to ensure fine adjustment of the center frequency. The predetermined period is termed a unit section hereinafter. Within one unit section, the number of stripes and the number of stripes whose widths are to be modulated may be selected as desired.

In the constructions of FIGS. 2B to 2E, sections each including a predetermined number of stripes are arranged periodically. No periodicity is seen within a section but periodicity is maintained between sections. In other words, the pitch between the i-th stripe in the n-th section and the i-th stripe in the (n+1)th section coincides with a given wavelength of a SAW having a desired frequency.

In addition to typical examples as described above, various combinations are possible and the average pitch can be selected within a wide range. Changes of the electrode stripe width and the free are stripe width may be treated respectively in terms of slightly different equivalent circuits which provide substantially the same frequency characteristics.

In the foregoing examples, the position of the stripe whose width is to be changed is fixed in each section but the position of the electrode stripe or the free area stripe whose width is to be changed may be changed from one section to another. As far as a predetermined number of stripes subject to the change of width are provided within a predetermined interval, similar effects can be attained. Further, in the interdigital electrodes described previously, the electrode fingers overlap uniformly but they may obviously be apodized. Inasmuch as the present invention aims at the fine adjustment of frequencies, changes of the electrode stripe width in excess of 1 μm are not considered.

As described above, the average pitch can be set finely so that precision of the fine adustment of center frequencies of the filter can be improved.

FIGS. 3A and 3B shows SAW devices with reflectors. Reflectors 9 and 10 reflect surface acoustic waves from transducers 1 and 2 and an array of stripe electrodes of about a λ/2 pitch and a λ/4 width electrode stripes. The reflectors 9 and 10 shown in FIG. 3A are short-circuited whereas those of reflectors 9' and 10' shown in FIG. 3B are not short-circuited. In the arrangement of the reflector and transducer, at least one component is adjusted in its frequency characteristics by changing widths of a predetermined number of stripes in every group of a predetermined number of stripes. Similar advantages can also be attained in a direct patterning without resort to the photomask technique, such as by using electron beams.

The SAW transducer provided with reflectors, shown in FIGS. 3A or 3B, constitutes a resonance circuit which can be represented by an equivalent circuit composed of the parallel connection of (1) serially connected inductance $L_1$ and capacitance $C_1$ and (2) capacitance $C_o$. The fundamental resonance characteristic is determined by the $L_1C_1$ resonant circuit having a resonant angular frequency $\omega r$ which can be represented by $$1/\sqrt{L_1C_1} .$$

The inter-electrode static capacitance constitutes the capacitance $C_o$ connected in parallel to the $L_1C_1$ resonant circuit and produces anti-resonance. The resonance frequency $fr = \omega r/2\pi$ can be adjusted finely as described before. The anti-resonance frequency $f_a$ may be modified to some extent in accordance with the resonance frequency $f_r$.

Various filter circuits can be formed by connecting such resonant circuits. For example, band pass filters can be formed by connecting the resonant circuits in L-shape or T-shape unit circuit and in ladder type or lattice type configurations. For example, a ladder type band pass filter is formed by serially connecting a plurality of equivalent resonant circuits ($f_{r1}$, $f_{a1}$) and connecting each interconnection point to the ground line through a different resonant circuit ($f_{r2}$, $f_{a2}$). Each constituent resonant circuit of such filters can be designed to have a desired resonance frequency. In the manufacture of such filters, a desired number of constituent resonant circuits, each as represented in FIGS. 3A or 3B, will be formed on a single piezoelectric wafer and may be mutually wire-bonded. Wirebonding of constituent resonant circuits may be preferable from the viewpoint of smaller reticle pattern size. For realizing various frequency characteristics, as desired, fine adjustment of resonant frequencies of respective constituent resonant circuits are required and will be achieved by adjusting the stripe widths of SAW transducer and/or reflector configurations as has been described. Especially, the present invention can be effectively applied in such cases where the characteristic frequencies, such as $f_{r1}$ and $f_{r2}$ as mentioned above, of constituent resonant circuits differ only slightly and cannot be realized by changing the width of all the stripes in one resonant circuit by an allowed step Δl of the photomask.

We claim:

1. An electrode structure for a surface acoustic wave (SAW) device which includes a plurality of electrode configurations deposited separately on a piezoelectric substrate, for converting an electric signal into a SAW signal, propagating the SAW signal in the piezoelectric substrate, and converting the SAW signal into another electric signal, comprising:

at least one of said electrode configurations including contiguous parallel stripes of alternating electrode and free areas, the electrode area being covered with a conductive material and the free area being not covered with the conductive material, and the parallel stripes being grouped into a plurality of arbitrary sections having a same number of stripes;

each of said arbitrary sections comprising a first part including a plurality of stripes of a first width and a second part including at least one stripe of a second width different from the first width, the number of the plurality of stripes of said first width being the same for each arbitrary section and the number of the at least one stripe of said second width being the same for each arbitrary section, whereby the center frequency of the frequency characteristic of said at least one electrode configuration otherwise to be determined by said first part is modified by the effect of said second part so as to provide a finely adjustable center frequency for the SAW device.

2. An electrode structure as defined in claim 1, wherein each of said arbitrary sections has a width in a direction of propagation of SAW therethrough larger than one wavelength of the SAW.

3. An electrode structure as defined in claim 1, wherein said stripes in the first and second part have widths in the direction of propagation of SAW which are approximately equal to a quarter wavelength of the SAW, and the electrode areas in said at least one electrode configuration constitute an interdigital electrode configuration by electrically connecting every second electrode area and the remaining electrode areas respectively.

4. An electrode structure as defined in claim 1, wherein said frequency characteristic has a pass band in the ultra-high frequency band.

5. An electrode structure as defined in claim 1, wherein said parallel stripes of said at least one electrode configuration have a width not larger than 3 μm and said second width different from the first width is by an amount not larger than 1 μm.

6. An electrode structure as claimed in claim 1, wherein the electrode configuration of each of said arbitrary sections is identical.

7. An electrode structure as defined in claim 6, wherein each arbitrary section has an even number of stripes and the successively disposed sections have a same pattern.

8. An electrode structure as defined in claim 1, wherein the at least one stripe of a second width is at least one of an electrode area stripe and a free area stripe.

9. An electrode structure as defined in claim 8, wherein the at least one stripe of a second width is at least one electrode area stripe, the second width being larger than the first width.

10. An electrode structure as defined in claim 8, wherein the at least one stripe of a second width is at least one free area stripe, the second width being larger than the first width.

11. An electrode structure as defined in claim 1, wherein the at least one stripe of a second width is one of an electrode area stripe and a free area stripe.

12. An electrode structure as defined in claim 11, wherein the second width is larger than the first width.

13. An electrode structure as defined in claim 1, wherein the center frequency as determined by the first width is finely adjusted by modifications of the effect of the second width with a precision of 1/10 or less of the center frequency as determined by the first width.

14. An electrode structure as defined in claim 1, wherein each arbitrary section includes stripes of only said first width and said second width.

15. An electrode structure for a surface acoustic wave (SAW) device which includes a plurality of electrode configurations deposited separately on a piezoelectric substrate, for converting an electric signal into a SAW signal, propagating the SAW signal in the piezoelectric substrate, and converting the SAW signal into another electric signal, comprising:

at least one of said electrode configurations including contiguous parallel stripes of alternating electrode and free areas, the electrode area being covered with a conductive material and the free area being not covered with the conductive material, and the parallel stripes being grouped into a plurality of arbitrary sections each having a same number of stripes;

each of said arbitrary sections comprising a first part including a plurality of stripes of a first width and a second part including at least one stripe of a second width different from the first width so as to provide a predetermined ratio of the number of stripes of said first and second widths, whereby the center frequency of the frequency characteristic of said at least one electrode configuration otherwise to be determined by said first part is modified by the effect of said second part so as to provide a finely adjustable center frequency for the SAW device.

16. An electrode structure as defined in claim 15, wherein the at least one stripe of a second width is at least one of an electrode area stripe and a free area stripe.

17. An electrode structure as defined in claim 15, wherein each arbitrary section includes stripes of only said first width and said second width.

* * * * *